US012601987B2

(12) United States Patent
Ono

(10) Patent No.: US 12,601,987 B2
(45) Date of Patent: Apr. 14, 2026

(54) LIGHT EMITTING APPARATUS AND IMAGE FORMING APPARATUS

(71) Applicant: FUJIFILM Business Innovation Corp., Tokyo (JP)

(72) Inventor: Seiji Ono, Ebina (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 1080 days.

(21) Appl. No.: 17/375,521

(22) Filed: Jul. 14, 2021

(65) Prior Publication Data

US 2022/0269190 A1 Aug. 25, 2022

(30) Foreign Application Priority Data

Feb. 19, 2021 (JP) ................................. 2021-025525
Feb. 19, 2021 (JP) ................................. 2021-025531

(51) Int. Cl.
H01L 29/18 (2006.01)
G03G 15/043 (2006.01)
(Continued)

(52) U.S. Cl.
CPC ......... G03G 15/043 (2013.01); G03G 15/045 (2013.01); H01L 25/0753 (2013.01); H01L 25/167 (2013.01); H10H 20/857 (2025.01)

(58) Field of Classification Search
CPC .............. G03G 15/043; G03G 15/045; G03G 15/04054; G03G 15/04036;
(Continued)

(56) References Cited

U.S. PATENT DOCUMENTS

2004/0046976 A1    3/2004  Ohno et al.
2005/0231580 A1   10/2005  Yamazaki et al.
(Continued)

FOREIGN PATENT DOCUMENTS

CN        108141950 A      6/2018
EP        3 386 276 A1    10/2018
(Continued)

OTHER PUBLICATIONS

Communication dated Jan. 31, 2022 issued by the European Patent Office in counterpart European Application No. 21189916.6.
(Continued)

*Primary Examiner* — Ismail A Muse
(74) *Attorney, Agent, or Firm* — Sughrue Mion, PLLC

(57) ABSTRACT

A light emitting apparatus includes: plural first light emitting units arranged at intervals along a predetermined first direction; plural second emitting units arranged at intervals along the first direction, maned at positions deviating tram the first light emitting units in a second direction intersecting the first direction, and arranged at positions deviating from the first light emitting units in the first direction, first wirings electrically connected to each of the first light emitting units by a semiconductor layer; and second wirings electrically connected to each of the second light emitting units, and disposed with an insulating layer interposed between the second light emitting units and the second wirings in a third direction that intersects the first direction and the second direction.

8 Claims, 18 Drawing Sheets

(51) Int. Cl.

| | | |
|---|---|---|
| *G03G 15/045* | (2006.01) |
| *H01L 25/075* | (2006.01) |
| *H01L 25/16* | (2023.01) |
| *H01L 33/00* | (2010.01) |
| *H10H 20/857* | (2025.01) |

(58) Field of Classification Search
CPC ... H01L 25/0753; H01L 25/167; H01L 33/62;
H01L 33/0016; H01L 33/44
See application file for complete search history.

(56) References Cited

U.S. PATENT DOCUMENTS

| | | | |
|---|---|---|---|
| 2007/0296803 | A1 | 12/2007 | Ohno et al. |
| 2008/0037097 | A1 | 2/2008 | Kasai |
| 2008/0063431 | A1 | 3/2008 | Ogihara et al. |
| 2013/0250031 | A1* | 9/2013 | Ohno ....................... B41J 2/385 347/238 |
| 2014/0320577 | A1* | 10/2014 | Ohno ................. G02B 27/0087 257/113 |
| 2018/0295715 | A1 | 10/2018 | Tsukuda et al. |
| 2019/0384205 | A1* | 12/2019 | Furuta ............. G03G 15/04045 |
| 2020/0096895 | A1 | 3/2020 | Ono |

FOREIGN PATENT DOCUMENTS

| | | | |
|---|---|---|---|
| JP | 2000-289250 | A | 10/2000 |
| JP | 2002111063 | A | 4/2002 |
| JP | 2005-224957 | A | 8/2005 |
| JP | 2008-36990 | A | 2/2008 |
| JP | 2008-210671 | A | 9/2008 |
| JP | 2013201395 | A | 10/2013 |
| JP | 5862404 | B2 | 2/2016 |
| JP | 202049720 | A | 4/2020 |
| JP | 2020-72165 | A | 5/2020 |

OTHER PUBLICATIONS

Office Action issued May 16, 2023 by the European Patent Office in counterpart European Patent Application No. 21189916.6.
Office Action dated Mar. 11, 2025, issued by Japanese Patent Office in Japanese Patent Application No. 2021-025531.
Office Action issued on Sep. 29, 2025 by the Chinese Patent Office in corresponding CN Patent Application No. 202110929434.X.
Communication dated Oct. 15, 2025, issued by European Patent Office in European Patent Application No. 21189916.6.
Communication dated Oct. 1, 2024, issued by the Japanese Patent Office in Japanese Application No. 2021-025531.
Communication dated Oct. 1, 2024, issued by the Japanese Patent Office in Japanese Application No. 2021-025525.

* cited by examiner

METAL WIRING ON GATE SEMICONDUCTOR

Qw

- METAL WIRING — 301 (302)
- p-TYPE SEMICONDUCTOR (COLLECTOR) — 213
- n-TYPE SEMICONDUCTOR (BASE) — 212
- p-TYPE SEMICONDUCTOR (EMITTER) — 211
- SUBSTRATE — 80

METAL WIRING ON INSULATING FILM

- METAL WIRING — 302
- INSULATING FILM — 303
- SUBSTRATE — 80

*Related Art*

*Related Art*

*Related Art*

LIGHT EMITTING APPARATUS AND IMAGE FORMING APPARATUS

CROSS REFERENCE TO RELATED APPLICATIONS

This application is based on and claims priority under 35 USC 119 from Japanese Patent Application No. 2021-025525 filed on Feb. 19, 2021 and Japanese Patent Application No. 2021-025531 filed on Feb. 19, 2021.

BACKGROUND

Technical Field

The present invention relates to a light emitting apparatus and an image forming apparatus.

Related Art

Regarding a light emitting apparatus such as a latent image forming device or a static eliminator for forming a latent image in an image, forming apparatus, a technique described in the following, Patent Literature 1 is a related art.

Patent Literature 1 describes a configuration in which, in a light emitting element head, a first light emitting element row and a second light emitting element row are arranged in a staggered manner, a light emitting signal is supplied from a φI terminal to odd-numbered light emitting thyristors, and a light emitting signal is supplied from a φIe terminal to even-numbered light emitting thyristors. As described in FIG. 6 of Patent Literature 1, a wiring extending toward the odd-numbered light emitting thyristors is disposed so as to pass between the even-numbered light emitting thyristors.

CITATION LIST

Patent Literature

Patent Literature 1: JP-A-2013-201395 (par. 0018 to 0021, FIGS. 4 to 6)

SUMMARY

Aspects of non-limiting embodiments of the present disclosure relate to improving, a degree of freedom in a case where a plurality of light emitting units are provided, as compared with a case where wirings to the respective light emitting units are the same.

Aspects of certain non-limiting embodiments of the present disclosure overcome the above disadvantages and/or other disadvantages not described above. However, aspects of the non-limiting embodiments are not required to overcome the disadvantages described above, and aspects of the non-limiting embodiments of present disclosure may not overcome any of the disadvantages described above.

According to an aspect of the present disclosure, there is provided a light emitting apparatus including:

a plurality of first light emitting units arranged at intervals along a predetermined first direction;

a plurality of second light emitting units arranged at intervals along the first direction, arranged at positions deviating from the first light emitting units with respect to a second direction intersecting the first direction, and arranged at positions deviating from the first light emitting units along the first direction;

a first wiring electrically connected to each of the first light emitting units by a semiconductor layer; and a second wiring electrically connected to each of the second light emitting units, and disposed with an insulating layer interposed therebetween in a third direction that intersects the first direction and the second direction.

BRIEF DESCRIPTION OF THE DRAWINGS

Exemplary embodiment(s) of the present invention will be described in detail based on the following figures, wherein:

FIG. 4 is an illustrative diagram of a configuration of a light emitting chip according to the first exemplary embodiment;

FIG. 6 is an example of an equivalent circuit diagram illustrating the configuration of the light emitting chip according to the first exemplary embodiment;

DETAILED DESCRIPTION

Figure 1:
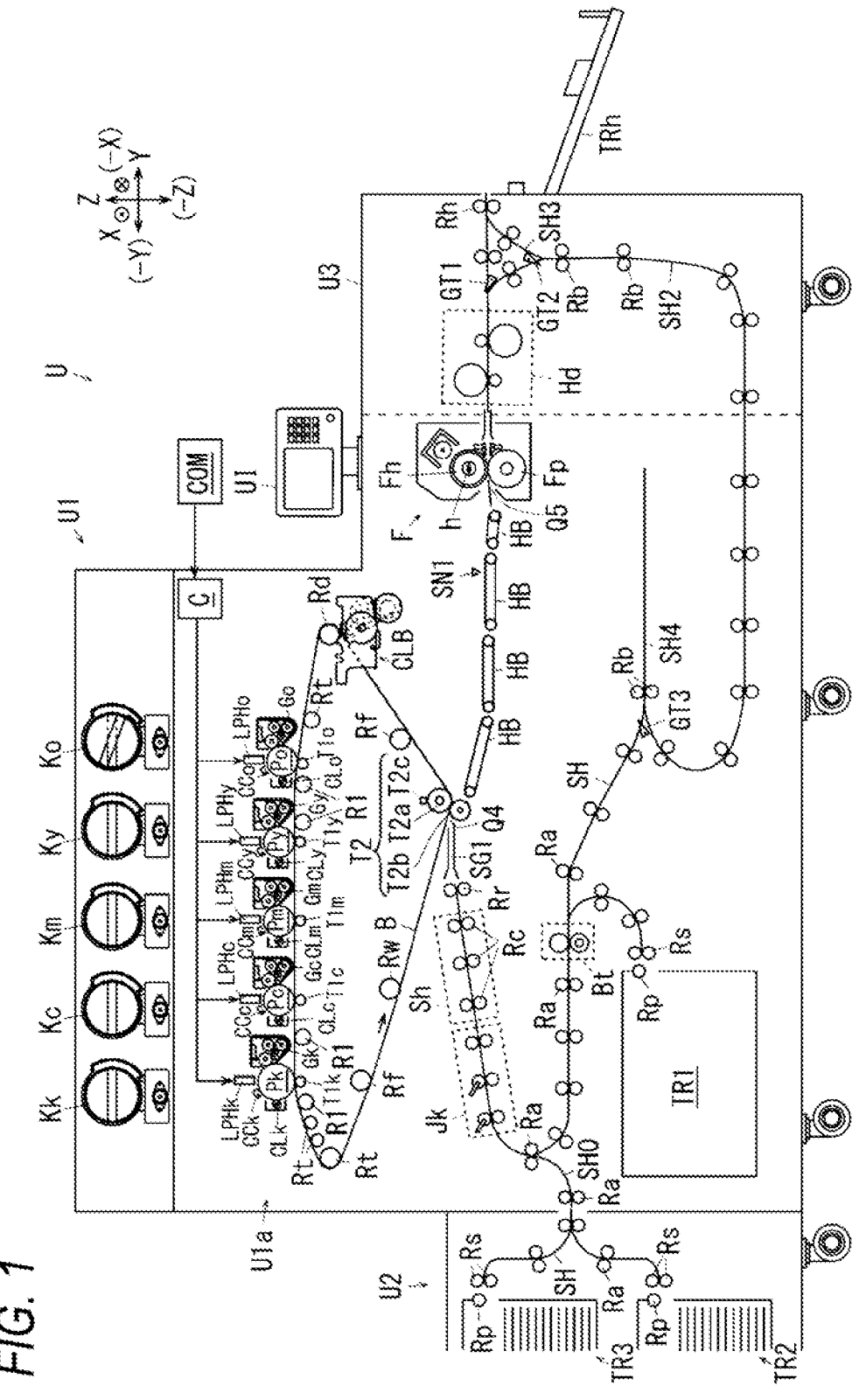
FIG. 1 is an overall illustrative view of an image forming apparatus according to a first exemplary embodiment.

Next, exemplary embodiments of the present invention will be described with reference to the drawings, but the present invention is not limited to the following exemplary embodiments.

In order to facilitate the understanding of the following description, in the drawings, a front-rear direction (a width direction of a medium) is referred to as an X-axis direction, a left-right direction (a feed direction of the medium) is referred to as a Y-axis direction, and an upper-lower direction is referred to as a Z-axis direction, directions or sides indicated by arrows X, –X, Y, –Y, Z, and –Z are referred to as front, rear, right, left, upper, and lower, or front, rear, right, left, upper, and lower sides, respectively.

Further, in the drawings, a circle "○" in which "•" is written means an arrow directed from a back side to a front side of a paper surface, and a circle "○" in which "x" is written means an arrow directed from the front side to the back side of the paper surface. Incidentally, in the following description using the drawings, illustration of members other than those necessary for the description is omitted as appropriate in order to facilitate understanding.

First Exemplary Embodiment (Description of Overall Configuration of Printer U of First Exemplary Embodiment)

FIG. 1 is an overall illustrative view of an image forming apparatus according to a first exemplary embodiment.

In FIG. 1, a printer U as an example of the image forming apparatus according to the first exemplary embodiment of the present invention includes a printer main body U1, a feeder unit U2 as an example of a supply device that supplies a medium to the printer main body U1, an operation unit U1 through which a user performs an operation, and a finisher U3 as an example of a post-processing device that performs post-processing on a medium output from the printer main body U1.

(Description of Configuration of Marking of First Exemplary Embodiment)

In FIG. 1, the printer main body U1 includes a control unit (an example of a control unit) C that controls the printer U, a communication unit (not illustrated) that receives image information transmitted from a print image server COM, as an example of an information transmission device, connected to an outside of the printer U via a dedicated cable (not illustrated), a marking unit U1a, as an example of a recording unit, that records an image on the medium, and the like. The print image server COM is connected to a personal computer PC as an example of an image transmission device to which information of an image to be to printed by the printer U is transmitted via a cable or a line such as a local area network (LAN).

The marking unit U1a includes photoconductors Py, Pm, Pc, and Pk for yellow (Y), magenta (M), cyan (C), and black (K), respectively, as an example of an image carrying unit, and a photoconductor Po for giving gloss to an image when a photo image or the like is printed. Surfaces of the photoconductors Py to Po are made of a photosensitive dielectric.

In FIG. 1, a charging unit CC1 as an example of a charging unit, an exposure device LPHk as an example of a latent image forming unit, a developing device Gk as an example of a developing unit, a primary transfer roller T1k as an example of a primary transfer unit, and a photoconductor cleaner CLk as an example of a cleaning unit for the image carrying unit are arranged around the black photoconductor Pk along a rotation direction of the photoconductor Pk.

Similarly, charging units CCy, CCm, CCc, and CCo, exposure devices LPHy, LPHm, LPHc, and LPHo, developing devices Gy, Gm, Ge, and Go, primary transfer rollers T1y, T1m, T1c, and T1o, and photoconductor cleaners CLy, CLm, CLc, and CLo are arranged around the other photoconductors Py, Pm, Pc, and Po, respectively.

Toner cartridges Ky, Km, Kc, Kk, and Ko, as an example of a developer collection unit, are attachably and detachably supported at an upper portion oldie marking unit Via. The toner cartridges Ky to Ko collects developers to be supplied to the developing devices Gy to Go.

An intermediate transfer belt B, as an example of an intermediate transfer unit and an example of an image carrying unit, is disposed below the photoconductors Py to Po. The intermediate transfer belt B is sandwiched between the photoconductors Py to Po and the primary transfer rollers T1y to T1o. A back surface of the intermediate transfer belt B is supported by a drive roller Rd as an example of a driving unit, a tension roller Rt as an example of a tension applying unit, a walking roller Rw as an example of a meandering preventing unit, plural idler rollers Rf as an example of a driven unit, a backup roller T2a as an example of a facing unit for secondary transfer, plural retracting rollers R1 as an example of a movable unit, and the primary transfer rollers T1y to T1o.

On a surface of the intermediate transfer belt B, a belt cleaner CUB as an example of a cleaning unit of the intermediate transfer unit is disposed in the vicinity of the drive roller Rd.

A secondary transfer roller T2b, as an example of a secondary transfer member, is disposed to face the backup roller T2a with the intermediate transfer belt B interposed therebetween. A contact roller T2c as an example of a contact unit, is in contact with the backup roller T2a in order to apply a voltage having a polarity opposite to a charging polarity oldie developer to the backup T2a.

The backup roller T2a, the secondary transfer roller T2b, and the contact roller T2c constitute a secondary transfer unit T2 as an example of a secondary transfer unit of the first exemplary embodiment, and the primary transfer rollers T1y to T1o, the intermediate transfer belt B, the secondary transfer unit T2, or the like constitute transfer units T1, B, and T2 as an example of the transfer unit of the first exemplary embodiment.

A paper feeding tray TR1, as an example of an accommodating unit, is provided below the secondary transfer unit T2. A recording sheet S as an example of a medium is accommodated in the paper feeding tray TR A pickup roller Rp as an example of a pickup unit and a retard roller Rs as an example of a retard unit are disposed diagonally upward to the right of the paper feeding tray TR1. A feed path SH along which the recording sheet S is fed extends from the retard roller Rs. Plural feed rollers Ra as an example of a feed unit that feeds the recording sheet S to a downstream side are disposed along the feed path SH.

A debarring device Bt as an example of a removing unit of an unnecessary portion is disposed downstream of the retard roller Rs. The deburring device Bt sandwiches the recording sheet S at a preset pressure, feeds the recording sheet S downstream, and removes the unnecessary portion of an edge of the recording sheet S, that is, deburring is performed.

A multi-feed detection device Jk is disposed downstream of the deburring device Bt. The multi-feed detection device Jk measures the thickness of the passing recording sheet S, and detects a state in which plural recording sheets S overlap, that is, a so-called multi-feed.

Correction rollers Rc as an example of a posture correction unit are disposed downstream of the multi-feed detection device Jk. The correction rollers Rc correct an inclination of the recording sheet S with respect to the feed direction, that is, a so-called skew.

A register roller Rr, as an example of an adjusting unit that adjusts a feed timing of the recording sheet S to the secondary transfer unit T2, is disposed downstream of the correction roller Re. Further, a sheet guide SG1, as an example of a medium guiding portion, is disposed downstream of the register roller Rr.

The feeder unit 132 is also provided with paper feed trays TR2, TR3 or the like configured similarly to the paper feeding tray TR1, the pickup roller Rp, the retard roller Rs, and the feed roller Ra, and the feed path SH from the paper feeding trays TR2, TR3 joins the feed path SH of the printer main body U1 on the upstream side of the multi-teed detection device Jk.

Plural transport belts HB as an example of a medium transport unit are disposed downstream of the secondary transfer roller T2b in the feed direction of tire recording sheet S.

A fixing device F, as an example of a fixing unit, is disposed downstream of the feet belt HB in the feed direction of the recording sheet S.

A decurler Hd, as an example of a curving correction unit, is disposed in a finisher U3 on a downstream side of the fixing device F. The decurler applies pressure to the recording sheet S to correct curvature, so-called curling, of the recording sheet S.

On a downstream side of the decurler Hd, a feed path SH extends toward an output tray TRh as an example of a stacking unit, An output roller Rh, as an example of an output unit, is disposed at a downstream end of the feed path SH.

A reversal path SH2, as an example of a feed path branched from the feed path SH, is formed downstream of the decurler Hd. A first gate GT1, as an example of a feed direction switching unit, is disposed at a branching portion between the feed path SH and the reversal path SH2.

Plural switchback rollers Rb as an example of a feed unit capable of rotating is forward and reverse directions are disposed in the reversal path SH2. On an upstream side of the switchback rollers Rb, a connection path SH3 is formed as an example of a feed path branches from an upstream portion of the reversal path SH2 and joins the branching portion of the feed path SH and the reversal path SH2 at the downstream side. A second gate GT2 as an example of a feed direction switching unit is disposed at a branching portion between the reversal path SH2 and the connection path SH3.

On a downstream side of the reversal path SH2, a return path SH4 for reversing the feed direction of the recording sheet S, that is, for switching back the recording sheet S, is disposed below the fixing device F. A switchback roller Rh as an example of a feed unit capable of rotating in forward and reverse directions is disposed in the return path SH4. A third gate GT3 as an example of a feed direction switching unit is disposed at an inlet of the return path SH4.

The feed path SH on the downstream side of the return path SH4 joins the feed path SH of the paper feeding tray TR1.

(Marking Operation)

In the printer U, when image information transmitted from the personal computer PC is received via the print image server COM, a job which is an image forming operation is started. When the job is started, the photoconductors Py to Po, the intermediate transfer belt B, and the like rotate.

The photoconductors Py to Po are driven to rotate by a driving source (not illustrated).

A preset voltage is applied to the charging units CCy to CCo to charge surfaces of the photoconductors Py to Po.

The exposure devices LPHy to LPHo, as an example of a latent image forming device and an example of a light emitting apparatus, output light Ly, Lm, Lc, Lk, and Lo for writing latent images according to a control signal from a control unit C to write electrostatic latent images on the charged surfaces of the photoconductors Py to Po.

The developing devices Gy to Go develop the electrostatic latent images on the surfaces of the photoconductors Py to Po.

The toner cartridges Ky to Ko replenish the developers consumed during the development in the developing devices Gy to Go.

The primary transfer rollers T1y to T1o are applied with a primary transfer voltage having a polarity opposite to the charging polarity of the developer, and transfer visible images on the surfaces of the photoconductors Py to Po to the surface of the intermediate transfer belt B.

The photoconductor cleaners CLy to CLo remove and clean the developers remaining on the surfaces of the photoconductors Py to Po after the primary transfer.

When the intermediate transfer belt B passes through the primary transfer region facing the photoconductors Py to Po, images are transferred and stacked in the order of O, Y, M, C, and K, and the intermediate transfer belt B passes through a secondary transfer region Q4 facing the secondary transfer unit T2. In the case of a monochrome image, a single color image is transferred and sent to the secondary transfer region Q4.

The pickup roller Rp feeds the recording sheet S from the paper feeding trays TR1 to TR3 to which the recording sheet S is supplied, according to the size of the received image information, the designation of the recording sheet S, the size, the type, and the like of the accommodated recording sheet S.

The retard rollers Rs separate and handle the recording sheets S fed from the pickup roller Rp one by one.

The debarring device fit applies a preset pressure to the passing recording sheet S to remove burrs.

The multi-feed detection device Jk detects the multi-feed of the recording sheets S by detecting the thickness of the recording sheets S passing through the multi-feed detection device R.

The correction roller Rc corrects the skew by bringing the passing recording sheet S into contact with a wall surface (not illustrated).

The register roller Rr feeds the recording sheet S in accordance with the timing at which the image on the surface of the intermediate transfer belt B is fed to the secondary transfer region Q4.

The sheet guide SG1 guides the recording sheet S fed by the register roller Rr to the secondary transfer region Q4.

In the secondary transfer unit T2, a secondary transfer voltage having the same polarity as the preset charging polarity of the developer is applied to the backup roller T2a via the contact roller T2c, and the image on the intermediate transfer belt B is transferred to the recording sheet S.

The belt cleaner CLB removes and cleans the developer remaining on the surface of the intermediate transfer belt B after the image is transferred in the secondary transfer region. Q4.

The feed belt HB holds the recording sheet S, to which the image has been transferred by the secondary transfer unit T2, on a surface thereof and feeds the recording sheet S to the downstream side.

The fixing device F includes a heating roller Fh as an example of a heating member, and a pressure roller Fp as an example of a pressurizing, member. A heater h as art example of a heat source, is accommodated inside the heating roller Fh. The fixing device F fixes an unfixed image on the surface of the recording sheet S by heating the recording sheet S passing through a fixing region Q5 where the heating roller Fh and the pressure roller Fp are in contact with each other while pressing the recording sheet S. The heating roller Fh and the pressure roller Fp constitute fixing members Fp, Fh of the first exemplary embodiment.

The decurler Hd applies a pressure to the recording sheet S that has passed through the fixing, device F to remove the curvature, so-called curling, of the recording sheet S.

When duplex printing is performed, the first gate Gil is activated to feed the recording sheet S that has passed through the decurler Hd to the reversal path SH2, and the recording sheet S is switched back in the return path SH4 to be fed again to the register roller Rr through the feed path SH, so that printing of a second side is performed.

In the case where the recording sheet S output to the output tray TRh is output in a state where the surface on which the image is recorded is an upper surface, that is, in the case of so-called face-up output, the recording sheet S is fed along the feed path SH and is output to the output tray TRh by the output roll Rh.

On the other hand, in a case where the recording sheet S is output in a state where the surface on which the image is recorded is a lower surface, that is, in a case of so-called face-down output, the recording sheet S is temporarily conveyed from the feed path SH to the reversal path SH2. Then, after a trailing end of the recording sheet S in the transport direction passes through the second gate GT2, the forward rotation of the switchback roller Rb is stopped. Then, the second gate GT2 is switched, the switchback roll Rh is reversely rotated, and the recording sheet S is fed along the connection path 5113 to the output tray TRh.

The output recording sheets S are stacked on the output tray TRh.

(Description of Latent Image Forming Device)

In the first exemplary embodiment, as the exposure devices (print heads) LPHy tea LPHo, a recording device using an LED print head (LPH) in which plural light emitting diodes (LEDs) are arranged in a main scanning direction to form a light emitting element array is employed in response to a request for downsizing of the device.

Further, in a light emitting chip in which plural light emitting elements are provided in a row on a substrate and a self-scanning light-emitting element array (SLED) in which lighting is controlled sequentially is mounted, light emitting thyristors coupled in series to the light emitting diodes are used. The thyristor is an element that includes an anode, a cathode, and at least one gate, is turned on when a voltage is applied between an anode and a cathode in a state in which a voltage equal to or higher than a certain voltage is applied to the gate, and maintains the on state while a current equal to or higher than a holding current flows between the anode and the cathode.

Figure 2:
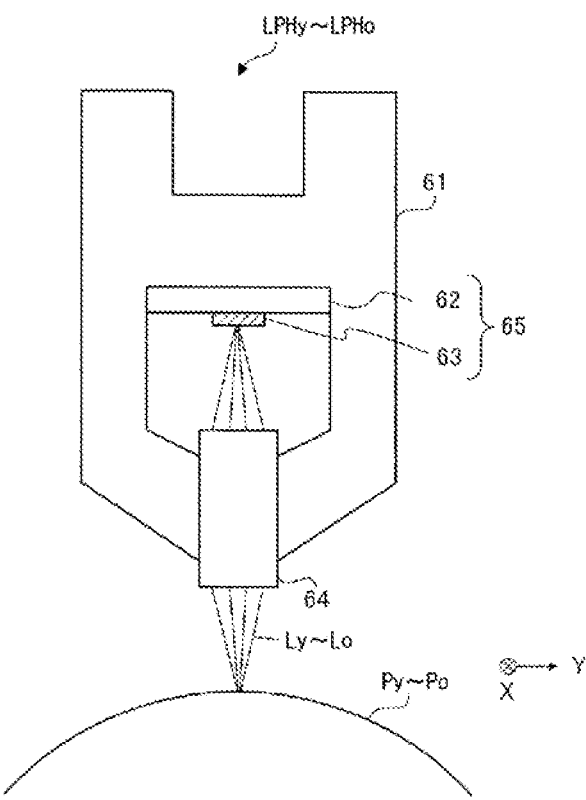
FIG. 2 is a cross-sectional of view of a latent image forming device according to the first exemplary embodiment.

FIG. 2 is a cross-sectional view of the latent image forming device according to the first exemplary embodiment.

Figure 3:
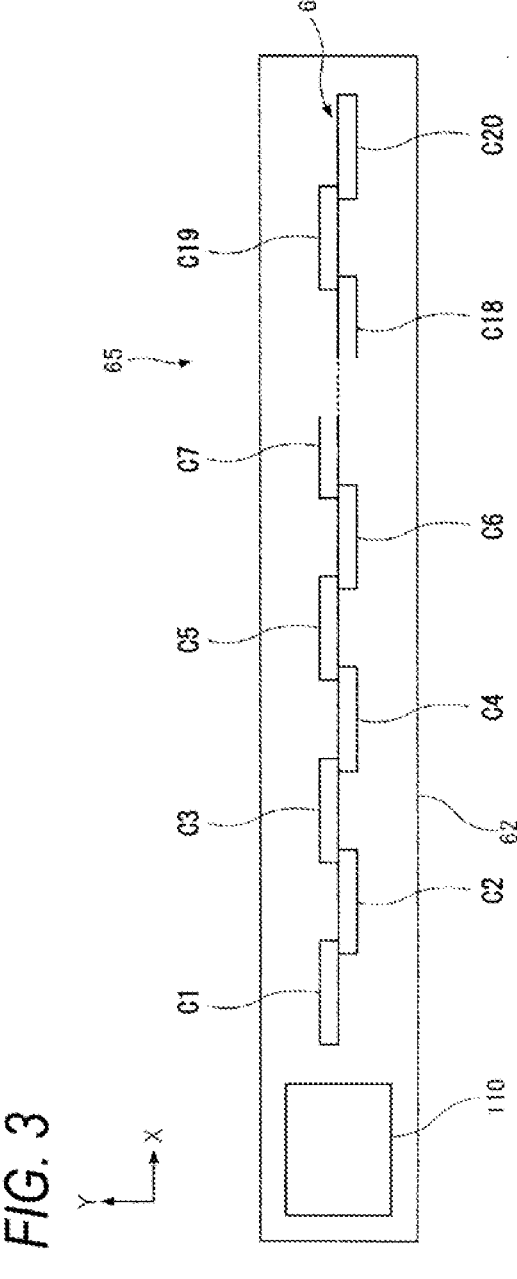
FIG. 3 is a top view of a light emitting unit according to the first exemplary embodiment.

FIG. 3 is a top view of a light emitting unit according to the first exemplary embodiment.

FIG. 2 is a cross-sectional view illustrating a configuration of the print heads LPHy to LPHo as an example of the light emitting apparatus. The print heads LPHy to LPHo include a housing 61 as an example of a frame body, a light emitting device 65 as an example of a light emitting unit main body, and a rod lens array 64 as an example of an optical unit. The light emitting device 65 includes a light source unit 63 having plural light emitting elements. The rod lens array 64 forms an image with the light emitted from the light source unit 63 on the surfaces of the photoconductors Py to Po to expose the photoconductors Py to Po.

The light emitting device 65 includes a circuit board 62 on which the light source unit 63, a signal generating circuit 110 (see FIG. 3) for driving the light source unit 63, or the like are mounted.

The housing 61 is made of metal, for example, supports the circuit board 62 and the rod lens array 64, and is set such that a light emitting surface, which is a surface of the light source unit 63 that emits light from the light emitting elements, is a focal plane of the rod lens array 64. The rod lens array 64 is disposed along a axial direction (the main scanning direction) of the photoconductors Py to Po.

(Light Emitting Device 65)

In FIG. 3, the light source unit 63 includes, as an example, twenty light emitting chips C1 to C20, on the circuit board 62. The light emitting chips C1 to C20 are arranged in two rows in a staggered manner in an X direction, which is the main scanning direction.

In the first exemplary embodiment, a total, of 20 light emitting, chips Ck (C1 to C20) are used, but the present invention is not limited thereto, and the number may be appropriately changed according to the design and specification.

The light emitting device 65 includes a signal generating circuit 110 that drives the light source unit 63. The signal generating circuit 110 is configured with, for example, an integrated circuit (IC). The light emitting device 65 may not include the signal generating circuit 110. At this time, the signal generating circuit 110 is provided outside the light emitting device 65, and supplies a control signal, or the like for controlling the light emitting chips C1 to C20 via a cable or the like. Here, it is assumed that the light emitting device 65 includes the signal generating circuit 110.

Figure 4:
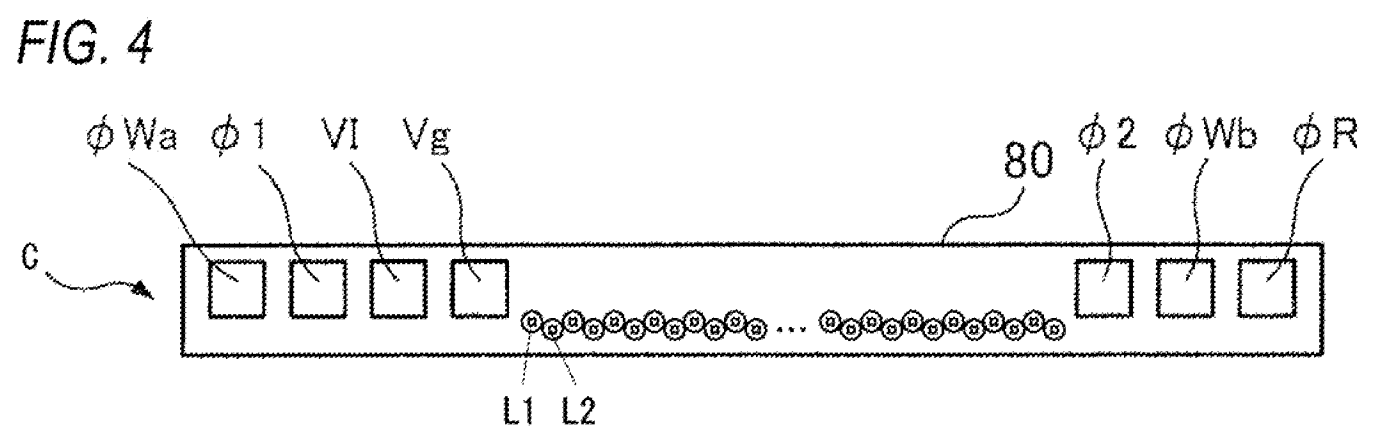

FIG. 4 is an illustrative diagram of a configuration of the light emitting chip according to the first exemplary embodiment.

Figure 5:
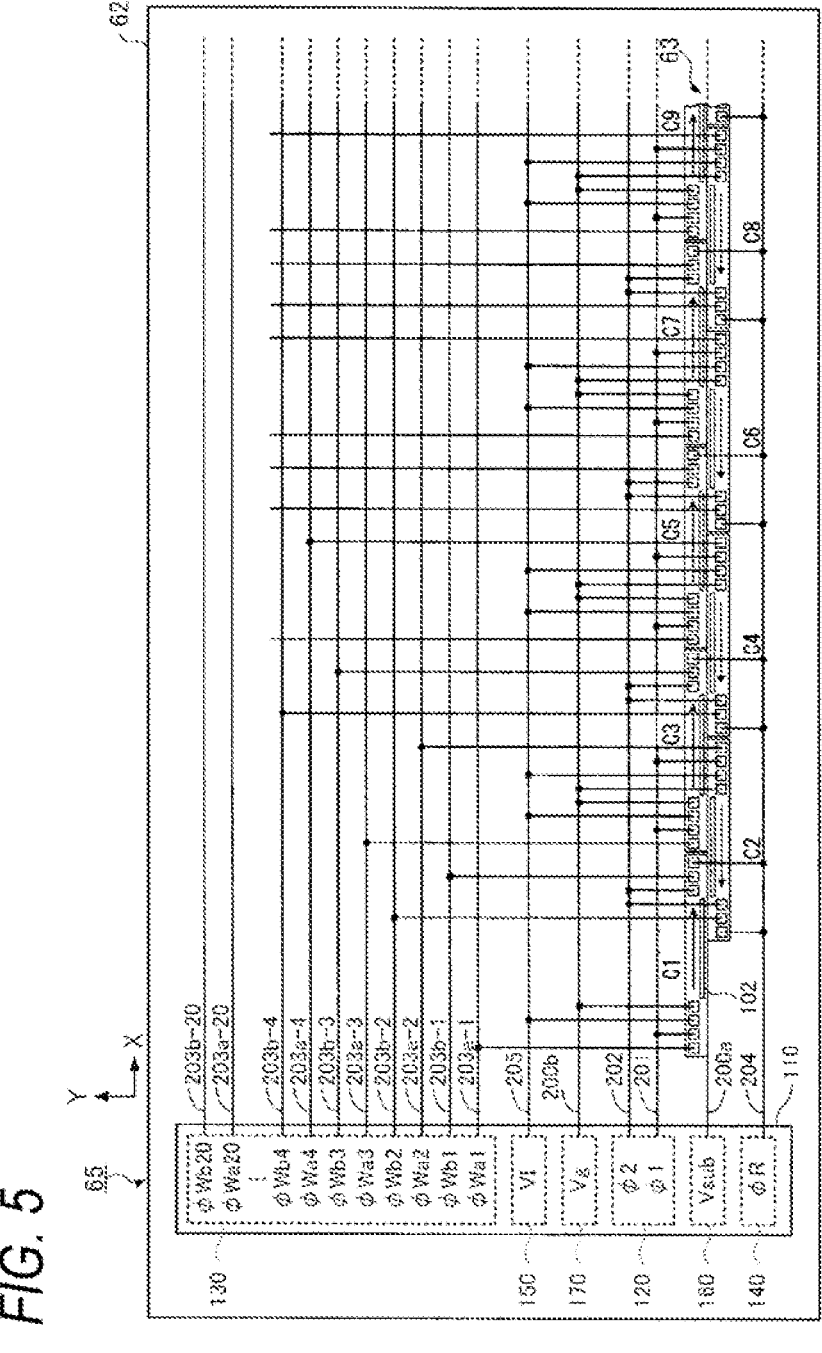
FIG. 5 is an illustrative diagram of a configuration of a signal generating circuit and a configuration of wirings (lines) on a circuit board according to the first exemplary embodiment.

FIG. 5 is an illustrative diagram of a configuration of the signal generating circuit and a configuration of wirings (lines) on the circuit board according to the first exemplary embodiment.

In FIG. 4, the light emitting chip Ck is configured with, for example, a semiconductor stacked body provided on a substrate 80 of a semiconductor having a rectangular surface shape as an example. On a surface of the substrate 80, the plural light emitting elements (in the first exemplary embodiment, the light emitting thyristors L1, L2, L3, . . . ) are arranged on a long side in a staggered manner along the long side.

In the first exemplary embodiment, the light emitting thyristors L1 to L20 include plural first light emitting units (first light emitting thyristors) L1, L3, L5, . . . , L19 arranged at intervals along the main scanning direction which is a predetermined first direction, and plural second light emitting units (second light emitting thyristors) L2, L4, L6, . . . , L20 arranged at intervals along the main scanning direction, and the second light emitting thyristors L2, L4, . . . , L20 are arranged at positions deviating from the first light emitting thyristors L1, L3, . . . , L19 with respect to a sub-scanning direction (an example of a second direction) intersecting the main scanning direction, and are arranged at positions shifted from the first light emitting thyristors L1, L3, . . . , L19 along the main scanning direction.

Hereinafter, when n is a natural number, each of the first light emitting thyristors L1, L3, . . . , L19 may be referred to as a "first light emitting thyristor L2$n$−1", and each of the second light emitting thyristors L2, L4, . . . , L20 may be referred to as a "second light emitting thyristor L2$n$".

In the first exemplary embodiment, the light emitting thyristors L1 to L20 are arranged in two rows, but may be arranged in three or more rows. Further, the number of the light emitting thyristors is not limited to 20, and may be arbitrarily changed according to design, specification, or the like.

In FIGS. 4 and 5, the light emitting; chip Ck is provided with terminals (a φ1 terminal, a φ2 terminal, a Vg terminal, a VI terminal, a φWa terminal, a φWb terminal and a terminal), which are plural bonding pads for taking in various control signals or the like, at both end portions in a long side direction of the surface of the substrate 80. These terminals are provided in the order of the φWa terminal, the φ1 terminal, the VI terminal, and the Vg terminal from one end portion of the substrate 80, and are provided in the order of the φR terminal, the φWb terminal, and the φ2 terminal from the other end portion of the substrate 80. A light emitting unit 102 is provided between the Vg terminal and the φ2 terminal. Further, a back surface electrode (not illustrated) is provided as a Vsub terminal on a back surface of the substrate 80.

Since various control signals and terminals are known in the related art as described in for example JP-A-2020-049720, a detailed description thereof will be omitted.

(Light Emitting Chip Ck)

Figure 6:
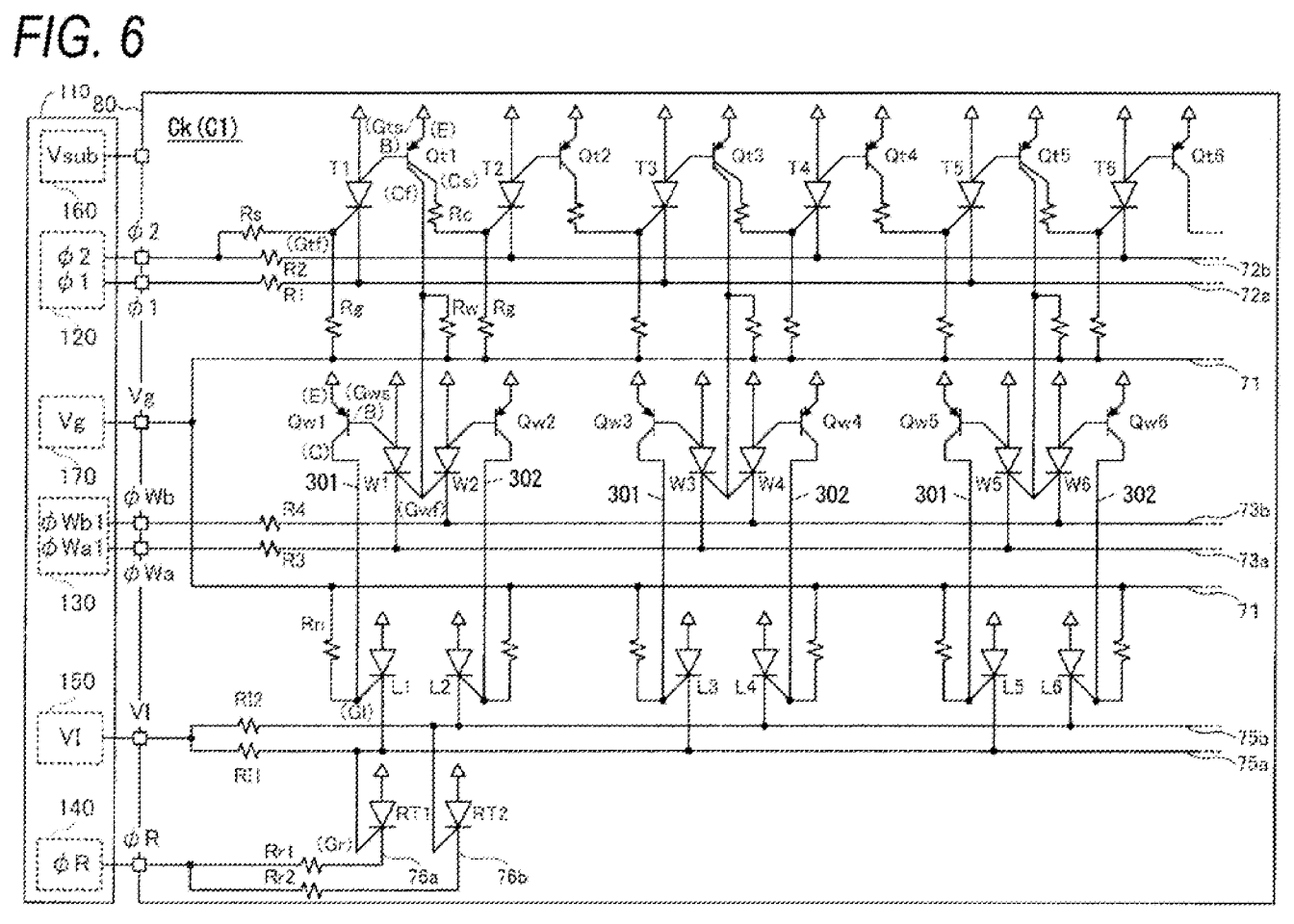

FIG. 6 is an example of an equivalent circuit diagram illustrating the configuration of the light emitting chip according to the first exemplary embodiment.

In FIG. 6, elements described below are represented by widely used circuit symbols. The positions of the respective terminals (the φ1 terminal, the φ2 terminal, the φWa terminal, the φR terminal, the VI terminal, and the Vg terminal) are different from those in FIG. 4, but are illustrated at a left end in the drawing for convenience of description. The Vsub terminal is provided as the back surface electrode on the back surface of the substrate 80. Here, the light emitting chip Ck will be described taking the light emitting chip C1 as an example in relation to the signal generating circuit 110, and description of the other light emitting chips C2 to C20 will be omitted.

The light emitting chip Ck includes the light emitting thyristors L1, L2, L3, . . . , the transfer thyristors T1, T2, T3, . . . , coupling transistors Qt1, Qt2, Qt3, . . . set thyristors W1, W2, W3, . . . , and setting transistors Qw1, Qw2, Qw3, . . . .

When the light entitling thyristors L1, L2, L3, . . . are not distinguished from one another, the light emitting thyristors L1, L2, L3, . . . , are referred to as a light emitting thyristor L. The same applies to the other components. A transfer thyristor T, a coupling transistor Qt, a set thyristor W, and a setting transistor Qw are arranged along the arrangement of the light emitting thyristor L (FIG. 4).

The transfer thyristor T is an example of a transfer element, and the set thyristor is an example of a setting element, in the first exemplary embodiment, the light emitting apparatus includes the light emitting thyristor L, resistors RI1, RI2, and Rn.

The light emitting chip Ck includes turning-off thyristors RT1 RT2. When turning-off thyristors RT1, RT2 are not distinguished each other, the turning-off thyristors RT1, R12 are referred to as a turning-off thyristor RT. Further, the light emitting chip Ck includes plural resistors. Note that the resistors are not denoted by the numbers for distinguishing the light emitting thyristors L1, L2, . . . , or the like.

The light emitting thyristors L, the transfer thyristors T, the set thyristor W, and the turning-off thyristors RT are thyristors each having a pnpn structure. As illustrated in the transfer thyristor T1, the transfer thyristor T is a four-terminal element having an anode, a first gate Gtf, a second gate Gts, and a cathode. In FIG. 6, the first gate Gtf is denoted as (Gtf). The same applies to the other components. Further, other equivalent elements are not denoted by reference numerals. The same applies to the other components.

As illustrated in the set thyristor W1, the set thyristor W is a four-terminal element having an anode, a first gate Gwf a second gate Gws, and a cathode. On the other hand, as illustrated in the light emitting thyristor L1, the light emitting thyristor L is a three-terminal element having an anode, a gate G1, and a cathode. Similarly, as illustrated in the turning-off thyristor RT1, the turning-off thyristor RT is a three-terminal element having an anode, a gate Gr, and a cathode.

The coupling transistor Qt and the setting transistor Qw are pap bipolar transistors. As illustrated in the coupling transistor Qt1, the odd-numbered coupling transistor Qt is a four-terminal element having an emitter E, a base B, a first collector Cf, and a second collector Cs. As illustrated in the coupling transistor Qt2, the even-numbered coupling transistor Qt is a three-terminal element having an emitter E, a base B, and a collector C. That is, the odd-numbered coupling transistor Qt is a multi-collector, and the even-numbered coupling transistor Qt is a single collector.

As illustrated in the setting transistor Qw1, the setting transistor Qw is a three-terminal element having an emitter E, a base B, and a collector C. Therefore, the setting transistor Qw is also a single collector.

Then, the light emitting chip Ck, is provided with plural wirings for connecting the above-described elements. The light emitting chip Ck includes a power supply lime 71 connected to the Vg terminal. The power supply voltage Vg is supplied from the power supply voltage supply unit 170 to the power supply line 71 via the Vg terminal connected a power supply line 200b.

The light emitting chip Ck includes transfer signal lines 72a, 72b respectively connected to the φ1 terminal and the tp2 terminal via resistors R1, R2. Transfer signals φ1, φ2 are transmitted from a transfer signal generating unit 120 to the φ1 terminal and the φ2 terminal via the transfer signal lines 201, 202, respectively. The light emitting chip Ck includes setting, signal lines 73a, 73b connected to the φWa terminal and the φWb terminal via the resistors R3, R4, respectively. Setting signals φWa1, φWh1 are transmitted from a setting signal generating unit 130 to the φWa terminal and the φWb terminal by setting signal lines 203a-1, 203b-1, respectively.

The resistors R1, R2, R3, and R4 are current limiting resistors provided to maintain a voltage.

The light emitting chip Ck includes turning-on signal lines 75a, 75b connected to the VI terminal via the resistors RI1, RI2, respectively A turning-on voltage VI is supplied from the turning-on voltage supply unit 150 to the VI terminal. The turning-on signal lines 75a, 75b are an example of a turning-on voltage line, and the turning-on voltage VI is an example of a turning-on voltage.

Further, the light emitting chip Ck includes turning-off signal lines 76a, 76b connected to the φR terminal via resistors Rr1, Rr2, respectively. A turning-off signal φR is transmitted from a turning-off signal generating unit 140 to the φR terminal through a turning-off signal line 204.

The light emitting chip Ck is provided with the Vsub terminal on the back surface electrode of the substrate 80. The reference voltage Vsub is supplied from the reference voltage supply unit 160 to the Vsub terminal through a power supply line 200a. The Vsub terminal is an example of a reference voltage line.

Figure 7A:
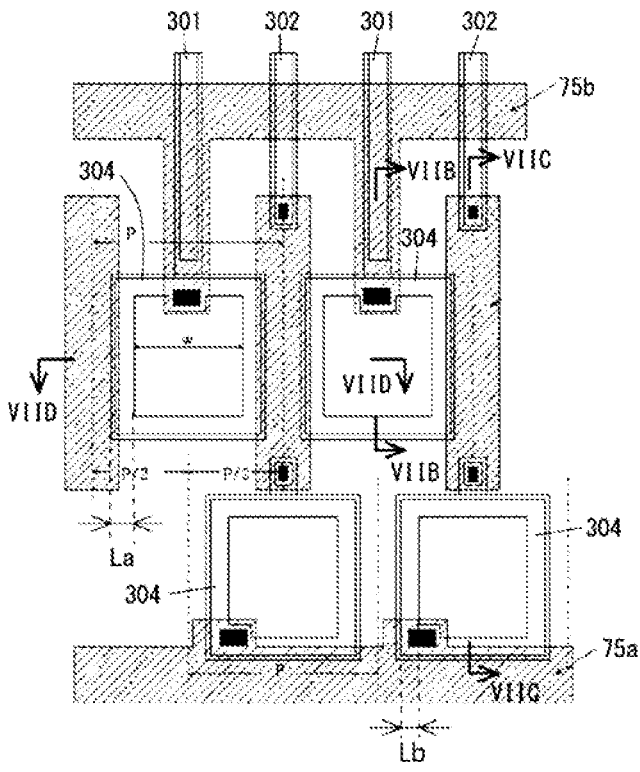
FIG. 7A is a plan view of the light emitting chip according to the first exemplary embodiment.
Figure 7B:
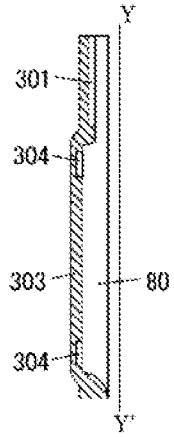
FIG. 7B is a cross-sectional view taken along a line VIIB-VIIB of FIG. 7A.
Figure 7C:
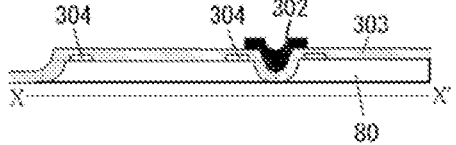
FIG. 7C is a cross-sectional view taken along a line VIIC-VIIC of FIG. 7A.
Figure 7D:
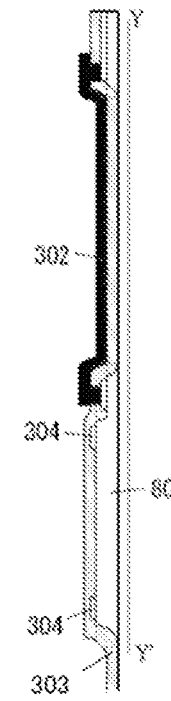
FIG. 7D is a cross-sectional view taken along a line VIID-VIID of FIG. 7A.

FIG. 7A is a plan view of a main portion of the light emitting chip according to the first exemplary embodiment, FIG. 7B is a cross-sectional view taken along: a line VIIB-VIIB of FIG. 7A, FIG. 7C is a cross-sectional view taken along a line VIIC-VIIC of FIG. 7A, and FIG. 7D is a cross-sectional view taken along a line VIID-VIID of FIG. 7A.

In FIGS. 7A to 7D, in the light emitting chip Ck of the first example embodiment, first wirings 301 extending from the collectors (C) of the first setting transistors (an example of a first control element) Qw1, Qw3, . . . are connected to the first light emitting thyristors L1, L3, . . . , L9, respectively. Second wirings 302 extending from collectors (C) of the second setting transistors (an example of a second control element) Qw2, Qw4, . . . , are connected to the second light emitting thyristors L2, L4, . . . , L20, respectively.

In FIG. 7B, the first wiring 301 is formed by being stacked on the substrate 80. An insulating layer 303 is further stacked on a front surface side of the first wiring 301. That is, the first wiring 301 is configured to supply a current inside the stack.

In FIG. 7C, a partial section of the second wiring 302 is made of a metal material stacked on a surface of the insulating layer 303 stacked on the substrate 80, and supplies a current to the second light emitting thyristor L2n. The second wiring 302 of the first exemplary embodiment is disposed on the front surface side so as to pass between the first light emitting thyristors L2n−1 and cover a part of an outer edge portion of the first light emitting thyristor L2n−1, and is disposed on the front surface side with the insulating layer 303 interposed therebetween so as not to energize an electrode portion 304 at the outer edge portion of the first light emitting thyristor L2n−1.

Figure 8A:
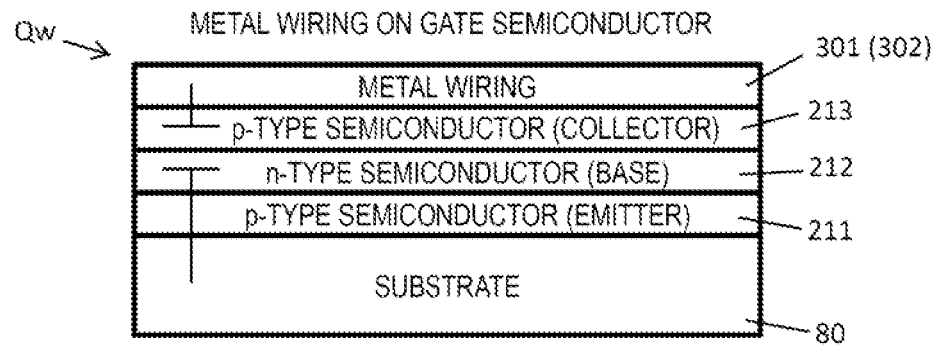
FIG. 8A is an illustrative diagram of a stacked structure of a part of a first wiring of the circuit according to the first exemplary embodiment.
Figure 8B:
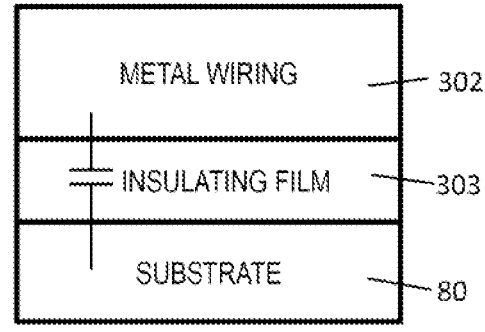
FIG. 8B is an illustrative diagram of a stacked structure of a pan of a second wiring of the circuit according to the first exemplary embodiment.

FIG. 8A is an illustrative diagram of a stacked structure of a part of the first wiring in the circuit according to the first exemplary embodiment, and FIG. 8B is an illustrative diagram of a stacked structure of a part of the second wiring in the circuit according, to the first exemplary embodiment.

In FIG. 8A, the setting transistor Qw has a so-called plop type transistor structure in which a p-type semiconductor 211 functioning as an emitter, an n-type semiconductor 212 functioning as a base, and a p-type semiconductor (a first layer) 213 functioning as a collector are stacked on the surface of a conductive substrate 80, and the metal first wirings 301, 302 are stacked on a surface of the p-type semiconductor 213.

On the other hand, in FIG. 8B, the second wiring 302 has a structure in which the insulating layer 303 is stacked on the surface of the substrate 80 and the second wiring 302 is stacked on a surface of the insulating layer (a second layer) 303 in a portion passing between the first light emitting thyristors L2n−1.

Therefore, in the light emitting chip Ck of the first exemplary embodiment, the first wiring 301 and the second wiring 302 adopt different configurations, and a degree of freedom of the arrangement of the first light emitting thyristor L2n−1 and the second light emitting thyristor L2n is increased as compared with a case where the same wiring is used. Therefore, the staggered arrangement as illustrated in FIG. 4 may be adopted without impairing an area of the light emitting thyristor L, and more light emitting thyristors L may be arranged in the main scanning direction.

Further, in the light emitting chip Ck of the first exemplary embodiment adopting the insulating layer 303, even when the second wiring 302 is wired near the other semiconductor layers 211 to 213, a signal of the second wiring 302 is prevented from being transmitted to the portion which is not desired to be transmitted.

Further, in the light emitting chip Ck of the first exemplary embodiment, the first wiring 301 and the second wiring 302 are different from each other in the stacked structure in a stacking direction as an example of a third direction, and are different from each other in an electric resistivity and a dielectric constant.

Specifically, in FIG. 8A, an electric capacitance is added between the base (the n-type semiconductor 212) and the collector (the p-type semiconductor 213). On the other hand, in FIG. 8B, an electric capacitance is added between the second wiring 302, the insulating layer 303, and the substrate 80. Although the thicknesses and materials of the semiconductors 211 to 213 and the insulating layer 303 are different, generally, since FIG. 8B has a lower dielectric constant and a wider electrode spacing of the capacitors, a capacitance per unit area is smaller. Therefore, a delay (a lighting delay) from an input of a lighting start signal to the start of lighting of the light emitting thyristor tends to be smaller in the second light emitting thyristor L2n passing through the second wiring 302 in the middle. If the length of the second wiring 302 is long, the delay of the second light emitting, thyristor L2n may be larger. In the following description, basically, a case where the delay of the second light emitting thyristor L2n is smaller will be described, and it goes without saying that when the delay of the second light emitting thyristor L2n is larger, magnitude and increase/decrease have an opposite relationship.

Since the delay of the first light emitting thyristor L2n−1 and the delay of the second light emitting thyristor L2n are different from each other, light emitting timings are different from each other. Although it is only necessary to delay an input timing of the signal to the set thyristor W by the delay difference, there is a problem that a large number of memories are required to change a lighting timing for each of the light emitting thyristors the configuration becomes complicated, and the cost increases and the control becomes complicated.

The delay frown the input of the signal (set signal) for turning on each the light emitting thyristors L to the turning on of each of the light emitting thyristors L includes two major elements, and the sum thereof is the delay. The first element is a delay until each set thyristor W is turned on. The second element is a delay until the setting transistor Qw charges the gate of the light emitting thyristor L and the light emitting thyristor L is turned on.

The first element is determined by a time constant of the setting signal lines 73a, 73b. Therefore, setting and adjustment may be performed by making, resistance values of the second resistance element R3 and the first resistance element R4 connected to the second setting signal line (the second connection line) 73a and the first setting signal line (the first connection line) 73b different from each other.

The second element is determined by parallel capacitance of the wirings 301, 302 connecting the collector of the setting transistor Qw to the gate of the light emitting thyristor L, and a collector current value of the setting transistor Qw for charging the gate.

Therefore, as an example, the time constant is increased by increasing the resistance value of the second resistance element R3, and a small delay of the second light emitting thyristor L2n is increased. That is a current flowing through a first setting transistor Qw2n−1 and a second setting transistor Qw2n is adjusted according to a difference in the parallel capacitance between the first wiring 301 and the second wiring 302. Accordingly, the delay difference with the first light emitting thyristor L2n−1 is suppressed, the difference between the light emission timings of the respective light emitting thyristors L is adjusted, and the respective light emitting thyristors L may be turned on at a target timing. Further, as compared with a configuration in which memories are provided corresponding to individual light emitting thyristors, it is possible to suppress complication of the configuration, an increase in cost, and complication of control.

Figure 9A:
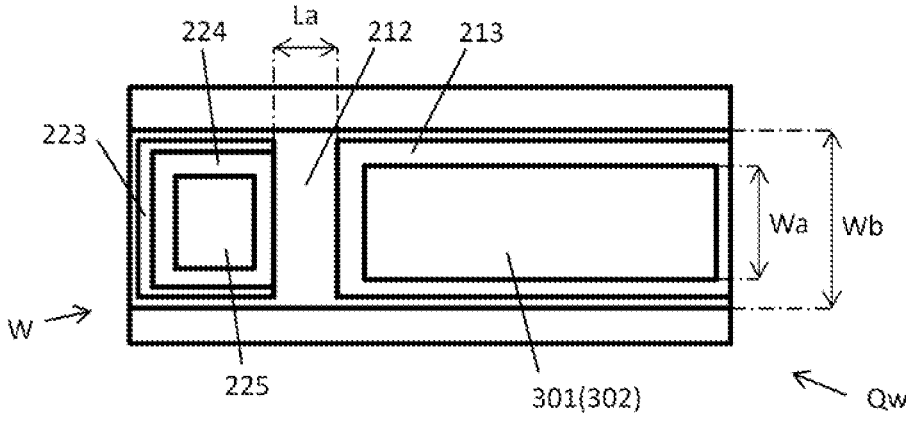
FIG. 9A is a plan view of an example of a stacked structure of a portion of a set thyristor and a coupling transistor according to the first exemplary embodiment.
Figure 9B:
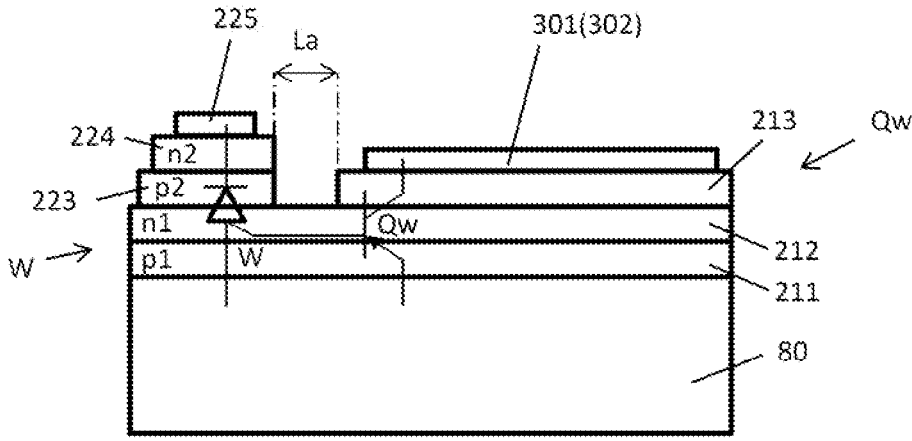
FIG. 9B is a cross-sectional view of an example of a stacked structure of a portion of a set thyristor and a coupling transistor according to the first exemplary embodiment.

FIG. 9A is a plan view of a stacked structure of a portion of a set thyristor and a coupling transistor according to the first exemplary embodiment, and FIG. 9B is a cross-sectional view of the stacked structure of the portion of the set thyristor and the coupling transistor according to the first exemplary embodiment.

In FIGS. 9A and 9B, the set thyristor W of the first exemplary embodiment has a so-called pnpn structure, the p-type semiconductor 211 and the n-type semiconductor 212 on the surface of the substrate 80 are shared with those of the setting transistor Qw, and a p-type semiconductor 223, an n-type semiconductor 224, and a cathode electrode 225 are stacked on a surface of the n-type semiconductor 212.

As an example of a method of coping with the second element, suppressing the delay difference described above may be realized by increasing an area of the second wiring 302. Specifically, in the plan view of FIG. 9A, it is possible to expand the area, increase a parasitic capacitance, and adjust the collector current value by increasing a width Wa of the second wiring 302.

In addition, it may also be realized by reducing the collector current when the setting transistor Qw connected to the second light emitting thyristor L2n is turned on. As a method of reducing the collector current, the resistor R3 is increased. In addition, it may also be realized by lowering a capability of the setting transistor Qw. As a method of reducing the capability of the setting transistor Qw, for example, in the plan view of FIG. 9A, a width Wb of the setting transistor Qw is reduced or a distance (an interval) La between the setting transistor Qw and die set thyristor W is increased, so that the characteristics of the setting transistor Qw may be reduced and the collector current may be reduced.

Therefore, in terms of the layout of the wiring, when the structure of some wiring is changed between the first light emitting thyristor L2n−1 and the second light emitting thyristor L2n, the light emission of the light emitting thyristor L is stabilized as compared with a case where a structure of the wiring to the first light emitting thyristor L2n−1 and the second light emitting thyristor L2n other than the signal to a gate layer is different between the first light emitting thyristor L2n−1 and the second light emitting thyristor L2n. Since the signal line to the gate layer is merely a set signal, it is not necessary for a large current to flow, and even if the resistance changes, since the impedance for light emission does not change, light emission efficiency does not decrease.

Second Exemplary Embodiment

Figure 10A:
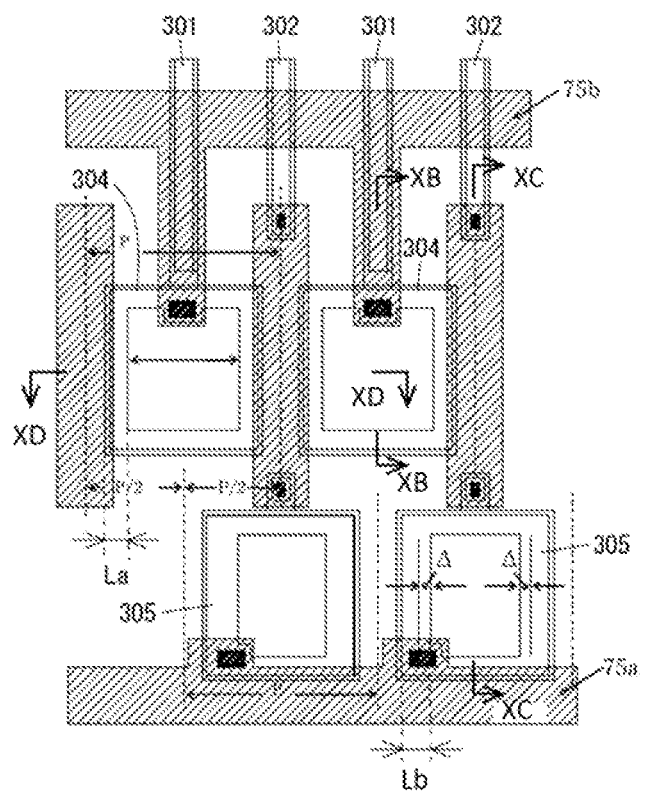
FIG. 10A is a plan view of a light emitting chip according to a second exemplary embodiment.
Figure 10B:
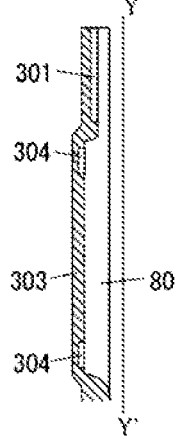
FIG. 10B is a cross-sectional view taken along a line XB-XB of FIG. 10A.
Figure 10C:
FIG. 10C is a cross-sectional view taken along the line XC-XC FIG. 10A.
Figure 10D:
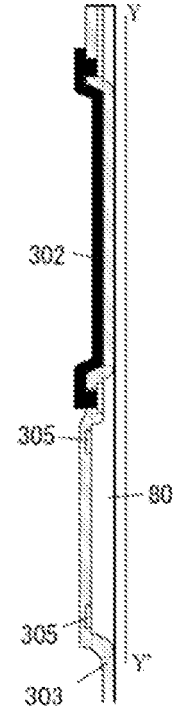
FIG. 10D is a cross-sectional view taken along a line XD-XD of FIG. 10A.

FIGS. 10A to 10D are illustrative views of a light emitting chip according to a second exemplary embodiment, wherein FIG. 10A is a plan view, FIG. 10B is a cross-sectional view taken along the line VIIB-VIIB of FIG. 10A, FIG. 10C is a cross-sectional view taken along the line VIIC-VIIC of FIG. 10A, and FIG. 10D is a cross-sectional view taken along the line VIID-VIID of FIG. 10A.

In FIG. 10A, in the light emitting chip Ck of the second exemplary embodiment, the first wirings 301 extending from collectors (C) of the setting transistors Qw1, Qw3, . . . are connected to the first light emitting thyristors L1, L3, . . . , L19, respectively. The second wirings 302 extending from collectors (C) of the setting transistors Qw2, Qw4, . . . are connected to the second light emitting thyristors L20, respectively.

In FIG. 10B, the first wiring 301 is formed by being stacked on the substrate 80. The insulating layer 303 is farther stacked on a front surface side of the first wiring 301. That is, the first wiring 301 is configured to supply a current inside the stack.

In FIG. 10C, the second wiring 302 is made of a metal material stacked on the surface of the insulating layer 303 stacked on the substrate 80, and supplies the current to the second light emitting thyristor L2n. The second wiring 302 of the second exemplary embodiment is disposed on the front surface side so as to pass between the first light emitting thyristors L2n−1 and cover the part of the outer edge portion of the first light emitting thyristor L2n−1, and is disposed on the front surface side with the insulating layer 303 interposed therebetween so as not to energize the electrode portion 304 at the outer edge portion of the first light emitting thyristor L2n−1.

In FIG. 10A, the light emitting chip Ck adjusts the light extraction efficiency of the first light emitting thyristor L2n−1 and the second light emitting thyristor L2n so as to reduce the difference in the quantity of light between the first light emitting thyristor L2n−1 and the second light emitting thyristor L2n. The light extraction efficiency refers to the efficiency of how much light in supplied energy is extracted as light with respect to an object. The light extraction efficiency varies depending on how the supplied energy is transmitted, a conversion rate at which the energy is converted to light by the light emitting unit, how much light is directed to an object, and the like. In the second exemplary embodiment, a width L2 of a second electrode 305 at the outer edge oldie second light emitting thyristor L2$n$ is set to be larger than a width L1 of the first electrode 304 of the first light emitting thyristor L2$n$–1 by a difference Δ. That is, the width of the second electrode 305 of the second light emitting thyristor L2$n$ is increased to shield the second light emitting thyristor L2$n$ in response to a decrease in a quantity of light emission due to an outer peripheral portion of the first light emitting thyristor L2$n$–1 being covered with the second wiring 302, so that the difference in the quantity of light is adjusted to be small. In the present exemplary embodiment, the light extraction efficiency is adjusted by shielding. Therefore, in the second exemplary embodiment, the portion of the second, electrode 305 increased by the difference Δ also functions as a light shielding member drat blocks light of the second light emitting thyristor L2$n$.

(Operation of Second Exemplary Embodiment)

In the light emitting chip Ck of the second exemplary embodiment having the above-described configuration, the second wiring 302 for the second light emitting thyristor L2$n$ is disposed in a state of covering the part of the outer edge of the first light emitting thyristor L2$n$–1 and affects the quantity of light emission of the first light emitting thyristor L2$n$–1. That is, as the resolution increases, a position of the second wiring 302 becomes closer to the first light emitting thyristor L2$n$–1 as the quantity of light from the first light emitting thyristor L2$n$–1 incident oil the rod lens array 64 on the second wiring 302 changes. In other words, the second wiring 302 affects an optical path of the outer edge outside an optical axis (a center of the light emitting thyristor L), and functions like, so to speak, a wall.

In the second exemplary embodiment, the width of the second electrode 305 is formed to be wide in accordance with a decrease in the quantity of light of the first light emitting thyristor L2$n$–1 in the second wiring 302. Therefore, in a case where there are the first light emitting thyristors L2$n$–1 affected by the quantity of light by the second wiring 302 and the second light emitting thyristor L2$n$ not affected by the quantity of light by the second wiring 302, a difference in the quantity of light between the light emitting thyristors L is suppressed while the complication of the configuration is suppressed, as compared with a case where the quantity of light from the light emitting thyristor L is individually adjusted. Further, for example, even if the usage is based on the premise of variable power supply voltage, such as adjusting an average quantity of light of the LPH by a supply voltage, the difference in the quantity of light is adjusted regardless of the supply voltage.

Figure 11A:
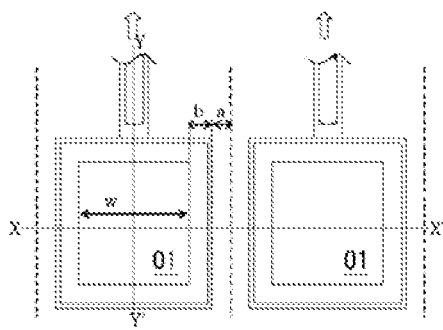
FIG. 11A is an illustrative diagram in a case where light emitting thyristors laving a related-art configuration are arranged in a straight line.
Figure 11B:
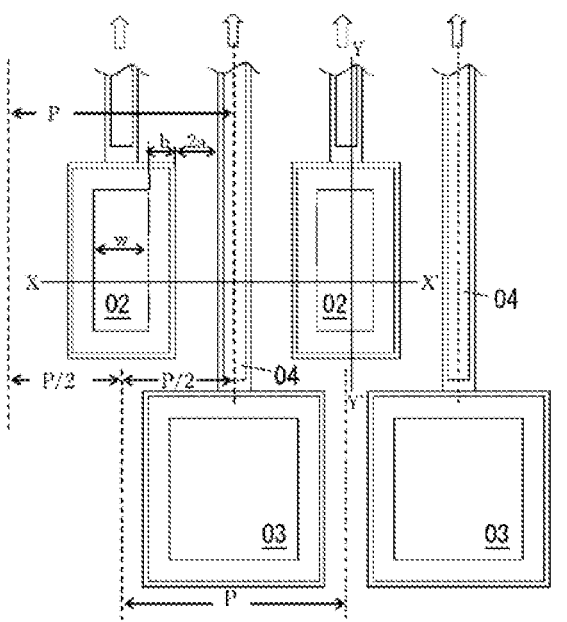
FIG. 11B is an illustrative diagram in a case where the light emitting thyristors having the related-art configuration are arranged in a zigzig manner and an area of the light emitting thyristors is reduced so as to avoid a wiring.
Figure 11C:
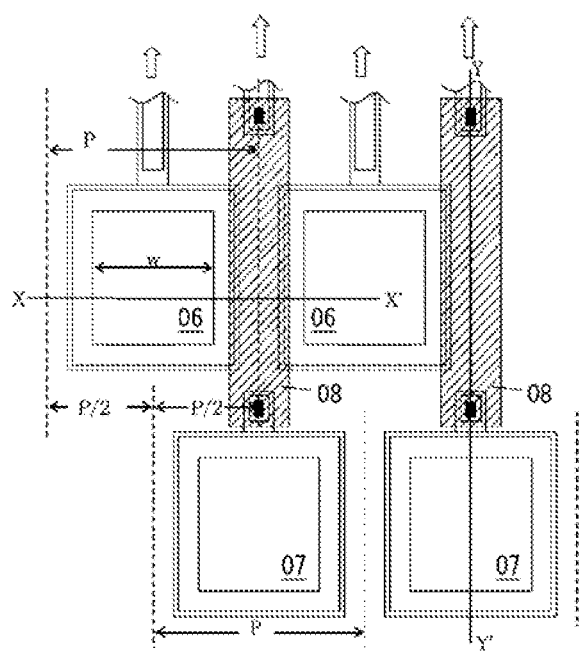
FIG. 11C is an illustrative diagram of a case where the wiring is stacked on a front surface of the light emitting thyristors having the related-art configuration.

FIGS. 11A to 11C are illustrative diagram of a related-art configuration, wherein FIG. 11A is an illustrative diagram in a case where light emitting, thyristors are arranged in a straight line, FIG. 11B is an illustrative diagram in a case where the light emitting thyristors are arranged in a zigzag manner and an area of the light emitting thyristors is reduced so as to avoid a wiring, and FIG. 11C is an illustrative diagram of a case where the wiring is stacked on a front surface of the light emitting thyristors.

As illustrated in FIG. 11A, when the light emitting thyristors 01 are arranged on a straight line but not in the zigzag manner, it is necessary to reduce the area of the light emitting thyristors 01 in order to reduce the resolution of the image. However, there is a limitation on the miniaturization of the light emitting thyristors 01, and there is also a problem that the cost increases when the light emitting thyristors 01 are miniaturized.

As illustrated in FIG. 11B, by arranging the light emitting thyristors in the zigzag manner in which a first light emitting thyristor 02 is a front side and a second light emitting thyristor 03 is on a back side, it is possible to shorten an interval between centers of the light emitting thyristors 02 and 03 in the main scanning direction, that is, the resolution may be made finer. However, as illustrated in FIG. 11B, in order to pass the wiring 04 to the second light emitting thyristor 03 between the first light emitting thyristors 02 while avoiding the first light emitting thyristor 02, there is a problem that a width of the first light emitting thyristor 02 is reduced, the current density is changed between the first light emitting thyristor 02 and the second light emitting thyristor 03 on the front side, and a variation occurs in the quantity of light emission.

Figure 12:
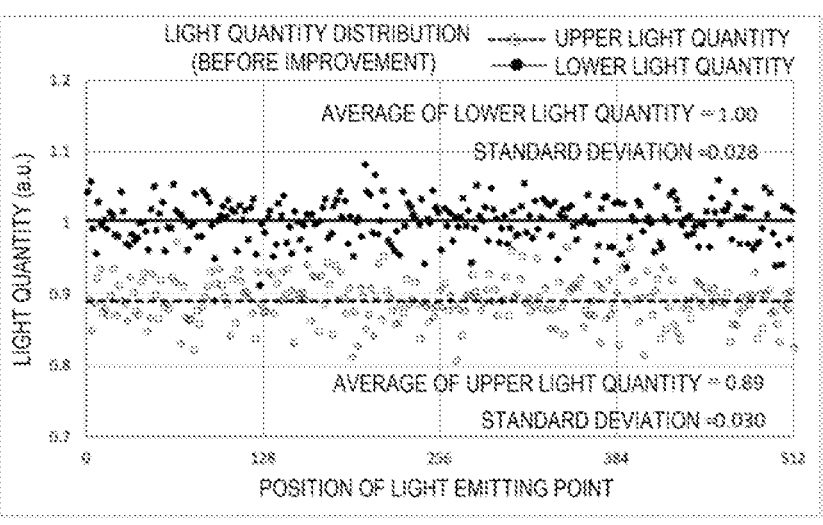
FIG. 12 is an illustrative diagram of experimental results of a light quantity distribution in the case oldie related-art configuration illustrated in FIG. 11C.

FIG. 12 is an illustrative diagram of experimental results of a light quantity distribution in the case of the related-art configuration illustrated in FIG. 11C.

As illustrated in FIG. 11C, when a first fight emitting thyristor 06 and a second emitting thyristor 07 have the same configuration and the second wiring 08 passes through front surface sides of outer edges of the first light emitting thyristor 06, it is possible to suppress a variation in the quantity of light emission as compared with the case illustrated in FIG. 11B, but it is difficult to completely eliminate the variation. Although it is not impossible to make adjustments for each of the first light emitting thyristors 06 by individually providing a memory for adjusting an adjustment quantity of the quantity of light and a current adjustment circuit, there is a problem that the configuration becomes complicated.

In FIG. 12, an experiment was conducted on a tight emitting chip having 512 light emitting thyristors. When the average quantity of light of the second light emitting thyristors 07 is set to 1, a standard deviation of the quantity of light of the second light emitting thyristors caused by an individual difference or the like was 0.028. The average quantity of light of the first light emitting thyristors 06 was 0.89, and the standard deviation was 0.030. Accordingly, a deviation of the average quantity alight between the first light emitting thyristor 06 and the second light emitting thyristor 07 was 11%(=1–0.89).

Figure 13A:
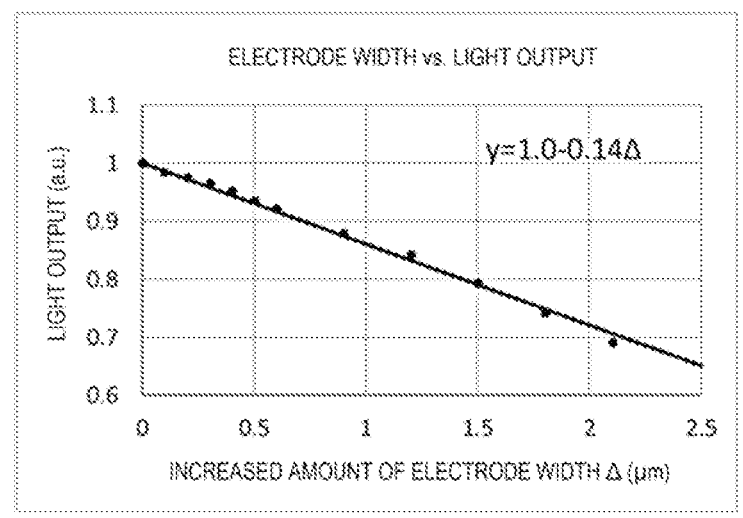
FIG. 13A is an illustrative diagram or experimental results indicating a relationship between an increment in an electrode width and a quantity of light in a configuration of the second exemplary embodiment.
Figure 13B:
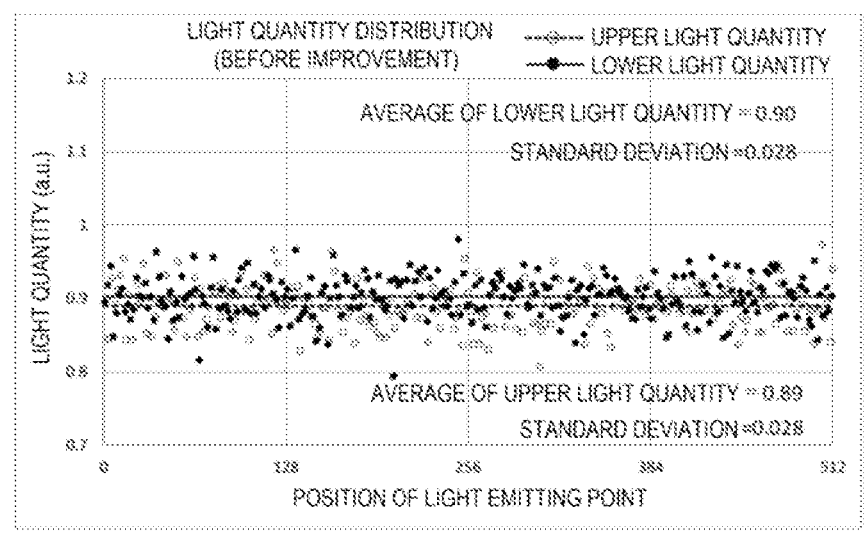
FIG. 13B is an illustrative diagram of experimental results when the electrode width of the second light emitting thyristor in the configuration of the second exemplary embodiment is increased by 0.8 μm.

FIGS. 13A and 13B are illustrative diagrams of experimental results in a configuration of the second exemplary embodiment, wherein FIG. 13A is an illustrative diagram of a relationship between an increment in an electrode width and a quantity of light, and FIG. 13B is an illustrative diagram of experiment results when an electrode width of the second light emitting thyristor is increased by 0.8 μm.

In FIG. 13A, it may be seen from the experimental results of an increment (a difference Δ) of the width L2 of the second electrode 305 of the second light emitting thyristor L2$n$ and an output quantity of light that the difference Δ may be set to 0.8 μm in order to reduce the output by 11%. In response to this, FIG. 13B indicates a result of conducting an experiment by preparing the light emitting chip Ck having the difference Δ of 0.8 μm. As illustrated FIG. 13B, it was confirmed that the average quantity of light of the second light emitting thyristor L2$n$ is 0.90, and a difference from the average quantity of light of the first light emitting thyristor L2$n$–1, which is 0.89, is 1%, so that it was confirmed that improvement has been made.

In the second exemplary embodiment, a case where the width in the main scanning direction is increased when the width L2 of the second electrode 305 is increased is illustrated, but the present invention is not limited thereto. It is also possible to increase the width in the sub-scanning direction or to change both the width in the main scanning direction and the width in the sub-scanning direction.

In the second exemplary embodiment, the width of the second electrode 305 is widened, that is, a portion of the difference Δ (an example of a third wiring) is, formed of the same material as a portion corresponding to the width L1 of the second electrode 305, but the present invention is not limited thereto, and the third wiring may be formed of another material.

Third Exemplary Embodiment

Next, a third exemplary embodiment of the present invention will be described, but in the description of the third exemplary embodiment, components corresponding to the components of the second exemplary embodiment are denoted by the same reference numerals, and detailed description thereof will be omitted.

The third exemplary embodiment is different from the second exemplary embodiment in the following points, but is configured in a similar manner as the second exemplary embodiment in other points.

In the light emitting chip Ck of the third exemplary embodiment, the first current limiting resistor RI2 is connected to the first turning-on signal line 75b (the first connection line) to which all of the first light emitting thyristors $L2n-1$ are connected. Further, the second current limiting resistor RI1 is connected to the second turning-on signal line 75a (the second connection line) to which all of the second light emitting thyristors $L2n$ are connected. In the third exemplary embodiment, the light extraction efficiency of the first light emitting thyristor $L2n-1$ and the second light emitting thyristor $L2n$ is adjusted by setting the resistance values of the two resistors RI1 and RI2 so as to reduce the difference in the quantity of light between the first light emitting thyristor $L2n-1$ and the second light emitting thyristor $L2n$. Therefore, the voltage and the current supplied to the first light emitting thyristor $12n-1$ and the voltage and the current supplied to the second light emitting thyristor $L2n$ are adjusted according to the quantity of light emission.

(Operation of Third Exemplary Embodiment)

Figure 14:
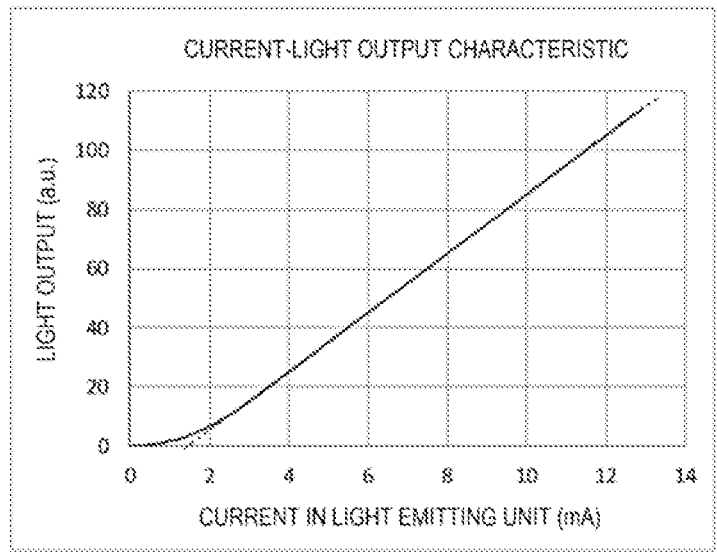
FIG. 14 is a diagram illustrating experimental results of a relationship between a supply current and a light output.

FIG. 14 is a diagram illustrating experimental results of a relationship between a supply current and a light output.

Figure 15:
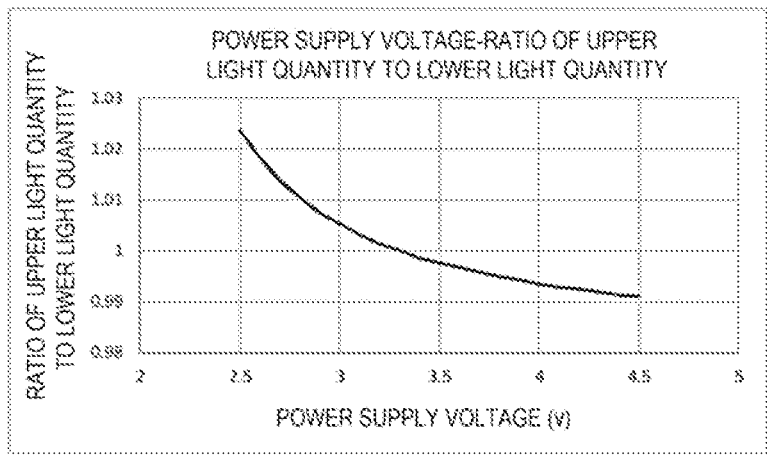
FIG. 15 is a diagram illustrating experimental results of a relationship between a power supply voltage and a ratio of the quantity of light when a first current limiting resistor is 200Ω and a second current limiting resistor is 220Ω.

FIG. 15 is a diagram illustrating experimental results of a relationship between a power supply voltage and a ratio of the quantity of light when a first current limiting resistor is 200Ω and a second current limiting resistor is 220Ω.

In the light emitting chip Ck of the third exemplary embodiment having the above-described configuration, the difference in the quantity of light of the light emitting thyristors L is suppressed by adjusting the current limiting resistors RI1, RI2. As illustrated in FIG. 14, when the supply current to the light emitting thyristors L is changed, the output of the light is changed. Further, in FIG. 15, it has been confirmed that, in the configuration of the third exemplary embodiment, in a case where the first current limiting resistor RI2 is set to 200Ω and the second current limiting resistor RI1 is set to 220Ω, when the power source voltage VI is changed, the ratio of the quantity of light between the first light emitting thyristor $L2n-1$ and the second light emitting thyristor $L2n$ is changed.

In the third exemplary embodiment, in FIG. 15, when the ratio of light quantity is 1, that is, when the power supply voltage is set to 3.3 V at which the ratio of the quantity of light between the first light emitting thyristor $L2n-1$ and the second light emitting thyristor $L2n$ is almost eliminated, the deviation of the light quantity is suppressed. That is, when the power supply voltage is fixed to a predetermined value, the difference in the quantity of light may be suppressed by adjusting the value(s) of one or both of the two current limiting resistors RI1, RI2. This method may be applied to a configuration in which the supply voltage does not change or a configuration in which the power supply voltage is constant. The reason is that in the usage based on the premise of variable power supply voltage, such as adjusting the average quantity of light of the LPH by the supply voltage, the difference in the quantity of light adjusted by the supply voltage also changes.

Further, it is also possible to perform one of the adjustment of the second exemplary embodiment and the adjustment of the third exemplary embodiment, but it is also possible to perform both of the adjustments.

Figure 16:
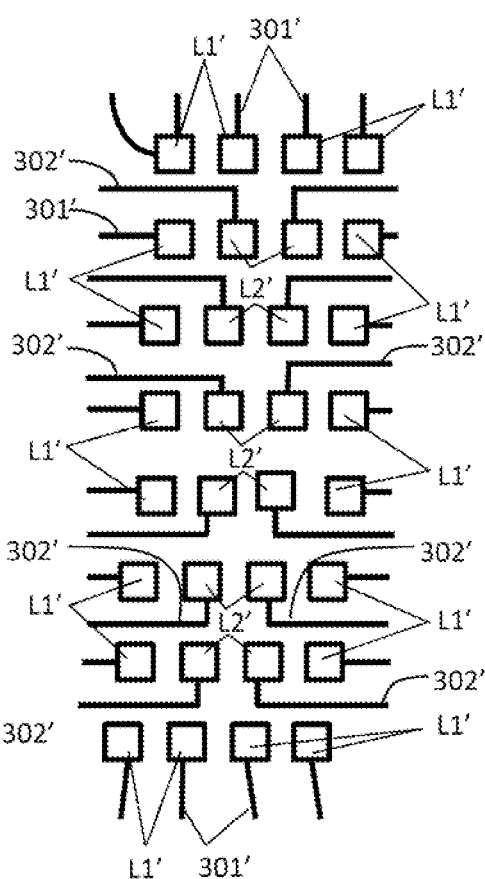
FIG. 16 is an illustrative diagram of another example of the arrangement of the light emitting unit in the present invention.

FIG. 16 is an illustrative diagram of another example of the arrangement of the light emitting unit in the present invention.

As illustrated in the first exemplary embodiment, the light emitting thyristors L are not limited to the configuration in which the light emitting thyristors L are arranged in the staggered manner. For example, as illustrated in FIG. 16, in the case where the light emitting thyristors L are densely arranged in a planar shape rather than in a row, a second wiring 302' to a second light emitting thyristor L2' may be disposed so as to pass between the first light emitting thyristors L1' with respect to the first light emitting thyristor L1' on an outer peripheral side and the second light emitting thyristor L2' on an inner side as in the first exemplary embodiment.

(Modifications)

Although the exemplary embodiments of the present invention have been described in detail above, the present invention is not limited to the above exemplary embodiments, and various modifications may be made within the scope of the gist of the present invention described in the claims. Modifications (H01) to (H010) of the present invention will be exemplified below. (H01) In the above-described example, the printer U is exemplified as an example of the image forming apparatus, but the present invention is not limited thereto, and for example, the image forming apparatus may be configured with a copying machine, a FAX, or a multifunction device having plural or all of these functions. Further, the present invention is not limited to an electrophotographic image forming apparatus, and may be applied to any image forming apparatus such as an inkjet image forming apparatus or a thermal transfer image forming apparatus.

(H02) In the above-described example, the configuration in which the developers of five colors are used as the printer U is exemplified, but the present invention is not limited thereto, and ma be applied to, for example, a monochrome image limning apparatus, or a multi-color image forming apparatus of four or less colors or six of more colors. (H03) In the above-described example, the intermediate transfer belt B having an endless belt shape is illustrated as an example of the image carrying unit, but the present invention is not limited thereto. For example, the present invention may also be applied to a cylindrical intermediate transfer drum, a photoconductor drum, and a photoconductor belt. The present invention may also be applied to a configuration in which an intermediate transfer body is not provided and an image is directly recorded on the recording sheet S from the photoconductor.

(H04) In the above-described example, the configuration in which the second wiring 302 that transmits the signal for turning on/off the second light emitting thyristor L$2n$ has an influence on the light quantity of the first light emitting thyristor L$2n$−1 is exemplified, but the present invention is not limited thereto. The present invention may be applied to any wiring that may generate a delay. (H05) In the above-described example, the structure of the light emitting thyristor is exemplified as the light emitting unit, but the present invention is not limited thereto. For example, the light emitting unit may be only the light emitting diode. Further, the wiring may also be applied to a configuration in which the current is supplied to each of the light emitting units, for example, a configuration described in, for example, JP-A-2020-123603. Further, the present invention is not limited to the configuration of an LED head including a light emitting diode or the like, and may also be applied to a configuration having a stacked substrate such as a vertical cavity surface emitting laser (VCSEL) or the like.

(H06) In the above-described example, the plural first light emitting thyristors L$2n$−1 and second light emitting thyristors L$2n$ are provided, but the present invention is not limited thereto. The present invention may also be applied to a case where the first light emitting thyristors L$2n$−1 and the second light emitting thyristors L$2n$ are disposed one by one. Further, for example, by combining (H05) and (H06), the light emitting unit is configured with the VCSEL, and modifications may be appropriately combined, such as when a first VCSEL and a second VCSEL are disposed one by one.

(H07) in the above-described example, the configuration in which one wiring 301 or 302 is provided for one light emitting thyristor L is exemplified, but the present invention is not limited thereto. For example, the present invention may also be applied to a configuration in which one wiring is branched and connected to plural light emitting thyristors, and turning on/off of the plural light emitting thyristors is simultaneously controlled through one wiring.

(H08) The first control element (first coupling transistor) and the second control element (second coupling transistor) are different from each other in the above-described example, but the present invention is not limited thereto. For example, the present invention may also be applied to a configuration in which the first control element and the second control element are the same, and the same signal is transmitted to the first wiring and the second wiring.

(H09) In the above-described example, the case of the print head used in the image forming apparatus has been illustrated as an example of the light emitting apparatus, but the present invention is not limited thereto. The print head may be applied to the light emitting element array used for optical transmission, and may be combined with an optical transmission path in this case, and the light emitted from the first light emitting unit and the light emitted from the second light emitting unit may be put in the same optical transmission path, or may be put in different optical transmission paths. Further, the print head may be applied to a light emitting substrate used for light measurement, light receiving elements that receive light from the first light emitting unit and the second light emitting unit may be configured on the same substrate, and a lens may be added such that the light emitted from the first light emitting unit and the second tight emitting unit passes before reaching an object.

(H010) In the above-described example, the configuration in which the light emitting units are applied to the respective light emitting thyristors, and the first wirings 301 are connected to the first light emitting thyristors L1, L3, . . . , L19 is exemplified, but the present invention is not limited thereto. For example, current may be supplied to a light emitting element group.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light emitting apparatus comprising:
a plurality of first light emitting units arranged at intervals along a predetermined first direction;
a plurality of second light emitting units arranged at intervals along the first direction, arranged at positions deviating from the first light emitting units in a second direction intersecting the first direction, and arranged at positions deviating from the first light emitting units in the first direction;
first wirings electrically connected to each of the first light emitting units by a semiconductor layer;
second wirings electrically connected to each of the second light emitting units, and disposed with an insulating layer interposed between the second light emitting units and the second wirings in a third direction that intersects the first direction and the second direction;
a first control element configured to output a control signal for controlling blinking of the first light emitting unit through the first wiring; and
a second control element configured to output a control signal for controlling blinking of the second light emitting unit through the second wiring,
wherein the light emitting apparatus is manufactured such that a current flowing through the first control element and the second control element is set using a difference in parallel capacitance between the first wiring and the second wiring.

2. The light emitting apparatus according to claim 1, further comprising:
a first connection line to which all of the first control elements are electrically connected;
a second connection line to which all of the second control elements are electrically connected;
a first resistance element connected to the first connection line; and
a second resistance element connected to the second connection line and having a resistance value different from the resistance value of the first resistance element.

3. The light emitting apparatus according to claim 2, wherein the resistance value of the first resistance element is larger than the resistance value of the second resistance element.

4. The light emitting apparatus according to claim 2, wherein the resistance value of the first resistance element and the resistance value of the second resistance element are set to reduce a difference in a quantity of light emitted by the first light emitting unit and the second light emitting unit.

5. The light emitting apparatus according to claim 1, wherein each of the light emitting units comprises a light emitting thyristor, wherein each of the control elements includes a transistor, and wherein an area of a metal wiring on a gate semiconductor connecting a collector of each of the control elements to a gate of each of the light emitting units is adjusted.

6. The light emitting apparatus according to claim 1, wherein each of the control elements includes a transistor, and wherein a collector current at the time of turning on each of the control elements is adjusted.

7. An image forming apparatus comprising:

an image carrying unit;

a charging unit configured to charge a surface of the image carrying unit; and a latent image forming device configured with the light emitting apparatus according to claim 1 that is configured to form a latent image on a charged image carrying unit.

8. A light emitting apparatus comprising:

a substrate;

a first light emitting unit comprising a thyristor structure in which a semiconductor is stacked on the substrate;

a second light emitting unit comprising a thyristor structure and provided on the substrate;

a first wiring electrically connected to a gate layer of the thyristor structure of the first light emitting unit and disposed to face the gate layer;

a second wiring electrically connected to a gate layer of the thyristor structure of the second light emitting unit and having a portion facing an insulating layer provided outside the thyristor structure;

a first control element configured to output a control signal for controlling blinking of the first light emitting unit through the first wiring; and a second control element configured to output a control signal for controlling blinking of the second light emitting unit through the second wiring, wherein a plurality of first light emitting units and a plurality of second light emitting units are provided, and wherein a difference between lighting timings of the first light emitting unit and the second light emitting unit caused by a difference between the first wiring and the second wiring is adjusted by adjusting a current flowing through the first control element and the second control element.

\* \* \* \* \*